United States Patent
Leventer et al.

(10) Patent No.: US 7,068,716 B1
(45) Date of Patent: Jun. 27, 2006

(54) METHOD AND SYSTEM FOR COMPRESSING GROUPS OF BASIC MEDIA DATA UNITS

(75) Inventors: Amir Leventer, Kfar Saba (IL); Nery Strasman, Ramat-Gan (IL)

(73) Assignee: BigBand Networks, Inc., Fremont, CA (US)

( * ) Notice: Subject to any disclaimer, the term of this patent is extended or adjusted under 35 U.S.C. 154(b) by 1007 days.

(21) Appl. No.: 09/810,154

(22) Filed: Mar. 15, 2001

(51) Int. Cl.
*H04N 11/02* (2006.01)
*H04N 7/12* (2006.01)

(52) U.S. Cl. .......................... 375/240.01; 375/240.02; 375/240.24

(58) Field of Classification Search ............. 375/240.2, 375/240.02, 240.25, 240.26, 240.03, 240.24; 348/298, 441
See application file for complete search history.

(56) References Cited

U.S. PATENT DOCUMENTS

| | | | | |
|---|---|---|---|---|
| 5,640,420 A * | 6/1997 | Jung | ........................ | 375/240 |
| 5,717,816 A | 2/1998 | Boyce et al. | | |
| 5,726,711 A * | 3/1998 | Boyce | ..................... | 348/408.1 |
| 5,751,357 A * | 5/1998 | Geib | ........................ | 348/400.1 |
| 5,805,762 A | 9/1998 | Boyce et al. | | |
| 5,996,022 A | 11/1999 | Krueger et al. | | |
| 6,023,553 A | 2/2000 | Boyce et al. | | |
| 6,055,272 A * | 4/2000 | Kim | ..................... | 375/240.23 |
| 6,081,295 A | 6/2000 | Adolph et al. | | |
| 6,163,573 A | 12/2000 | Mihara | | |
| 6,415,057 B1 * | 7/2002 | Suzuki et al. | ............... | 382/239 |
| 6,526,099 B1 * | 2/2003 | Christopoulos et al. | ..................... | 375/240.26 |
| 6,580,757 B1 * | 6/2003 | Amonou | ................ | 375/240.11 |
| 6,587,508 B1 * | 7/2003 | Hanamura et al. | ...... | 375/240.24 |
| 6,763,067 B1 * | 7/2004 | Hurst | .................... | 375/240.03 |

OTHER PUBLICATIONS

Seung Chul Yoon; Ratakonda, K.; Ahuja, N., Low bit-rate video coding with implicit multiscale segmentation, Circuits and Systems for Video Technology, IEEE Transactions on, vol.: 9 , Issue: 7 , Oct. 1999 , pp.:1115-1129.*

* cited by examiner

*Primary Examiner*—Gims Philippe
*Assistant Examiner*—Erick Rekstad
(74) *Attorney, Agent, or Firm*—Sonnenschein, Nath & Rosenthal, LLP

(57) ABSTRACT

The invention provides a method for compressing a group of basic media data units, the method comprising the steps of: (a) receiving the group of basic media data units; (b) for each basic media data unit of the group performing the steps of: (b1) partially decoding the basic media data unit; (b2) determining whether to reduce the size of the basic media data unit of the received block in view of a predefined relationship between a predefined compression ratio (PCRA) and a residual ratio (RR); (b3) reducing the size of the basic media data unit, in view of the determination, such that an optimal reduction to quality degradation of the basic media data block is achieved; and (b4) partially encoding the basic media data unit.

21 Claims, 4 Drawing Sheets

METHOD AND SYSTEM FOR COMPRESSING GROUPS OF BASIC MEDIA DATA UNITS

FIELD OF THE INVENTION

The present invention relates to communication methods in general, and to methods for compressing groups of basic media data units.

BACKGROUND OF THE INVENTION

Methods and systems for compressing and transmitting video signals are known in the art. Compressed digital video is largely becoming the preferred medium to transmit video to viewers everywhere. The Motion Pictures Expert Group (MPEG) specifications are standardized methods for compressing and transmitting video. In general, MPEG is used today for transmitting video over terrestrial, wireless, satellite and cable communication channels and also for storing digital video.

In accordance with the MPEG standard raw video signals are processed with motion compensation, transform coding, quantization and variable length encoding. Usually, the product of the transform coding are DCT (discrete cosine transform coefficients), the DCT coefficients of a macroblock are quantized and are represented by pairs of amplitude/runlength, whereas the runlength value indicates the number of zeroes between two non-zero coefficients. The amplitude/runlength pairs of a macroblock are coded by a variable length coding scheme to provide compressed video streams. The compressed video streams are usually segmented to packets, for allowing the transmission of the packets over a medium. The process of transforming raw video into compressed video is referred to as compression or encoding. The step of variable length encoding/decoding is also referred to as partially encoding/decoding.

Due to various constraints, such as but not limited to a limited communication channel capacity, or a limited storage space, there is a need to reduce the amount of data required to represent visual information. Various methods for performing data reduction are illustrated at U.S. Pat. No. 6,023,553 of Boyce, et al. The U.S. patent illustrates a method and apparatus for extracting intra-coded video pictures from a video bit-stream and processing the selected intra-coded video pictures to generate intra-coded video pictures suitable for use during video tape recorder ("VTR") trick play operation.

There is a need to provide efficient methods for performing data reduction with minimal quality penalty. There is a further need to provide methods for performing fast data reduction without adding excessive delay.

SUMMARY OF THE PRESENT INVENTION

It is an object of the present invention to provide novel methods for visual data reduction.

In accordance with the present invention, there is thus provided methods that involve receiving compression information being indicative of a size of a source group or sub-group of basic media data units and of a size of a target group or sub group of basic media data units, tracking the compression decisions and the results of the compression process to determine whether a basic media data unit is to be compressed. The compression of a basic media data unit is performed in order to achieve an optimal compression to quality loss ratio of the basic media data unit. The optimal ratio is maintained through a large range of requested compression ratio, the requested compression ratio related to the group of basic media data units.

According to an aspect of the invention the basic media data units include compressed video signals, such as but not limited to MPEG compliant video signals, and the data reduction involves transcoding.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1:
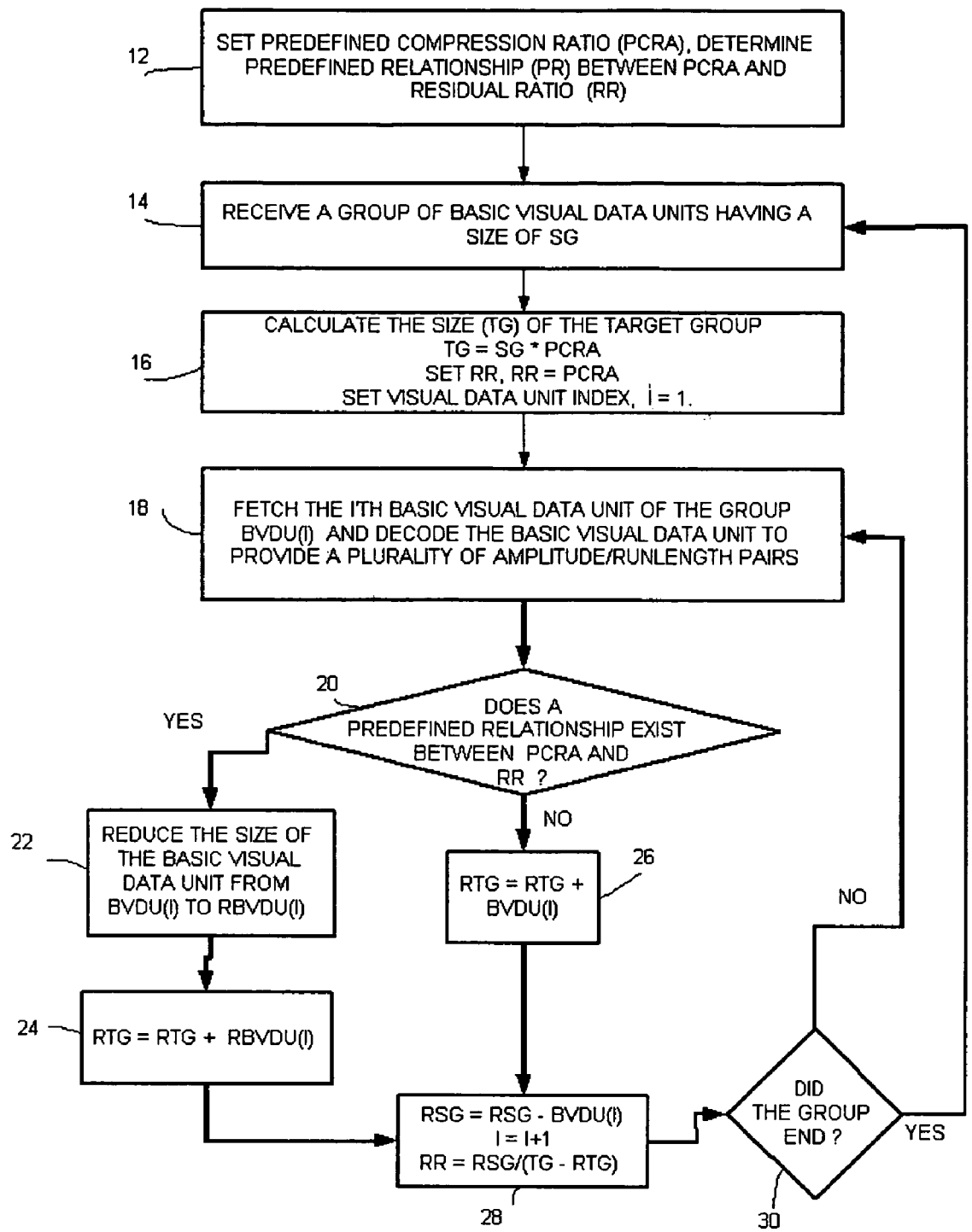
FIGS. 1–3 are flow chart diagrams illustrating methods for compressing a group of basic media data units, in accordance with preferred embodiments of the present invention.

The present invention overcomes the disadvantages of the prior art by providing methods that perform fast data reduction by performing basic media data reduction decisions in view of previously known parameters. The methods do not require analyzing a full group of basic media data units before compressing a basic media data unit.

The method involves receiving compression information being indicative of a size of a source group or sub-group of basic media data units and of a size of a target group or sub group of basic media data units, tracking the compression decisions and the results of the compression process to determine whether a basic media data unit is to be compressed. The compression of a basic media data unit is performed in order to achieve an optimal compression to quality loss ratio. The optimal ratio is maintained through a large range of requested compression ratio, the requested compression ratio related to the group of basic media data units.

The term basic media data unit refers to a set of signals being representative of various information, such as visual information, audio information, audio visual information, media command information, data, and the like. The set of signals can be in a raw form or in a compressed or other wise processed form. The length of the set of signals can vary and include a macroblock, a packet, a slice, a picture, and the like. A basic media data unit is usually represented by a plurality of amplitude/runlength pairs. For convenience of explanation only, the following description addresses a basic visual data unit that includes a compressed representation of visual information.

The invention provides a method for compressing a group of basic media data units, the method including the steps of: (a) receiving the group of basic media data units; (b) for each basic media data unit of the group performing the steps of: (b1) partially decoding at least a portion of the basic media data unit to provide a plurality of amplitude/runlength pairs; (b2) determining whether to reduce the size of the basic media data unit in view of a predefined relationship between a predefined compression ratio (PCRA) and a residual ratio (RR); (b3) reducing the size of the basic media data unit, in view of the determination, by changing the values of at least some of the amplitudes; and (b4) partially encoding the basic media data unit.

The invention provides a method for compressing a group of basic media data units, the method including the steps of: (a) receiving the group of basic media data units; (b) for each basic media data unit of the group performing the steps of: (b1) partially decoding at least a portion of the basic media data; (b2) determining whether to reduce the size of the basic media data unit of the received block in view of a predefined relationship between a predefined compression ratio (PCRA) and a residual ratio (RR); (b3) reducing, in view of the determination, the size of a basic media data unit such that an optimal reduction to quality degradation of the basic media data block is achieved; and (b4) partially encoding the basic media data unit.

The invention provides a method for compressing a group of basic media data units wherein the amplitude/runlength pairs represent DCT coefficients.

The invention provides a method for compressing a group of basic media data units wherein the step of reducing includes mapping low value amplitudes to zero.

The invention provides a method for compressing a group of basic media data units wherein the low-value amplitudes equal one.

The invention provides a method for compressing a group of basic media data units wherein the step of reducing includes quantizing the amplitudes.

The invention provides a method for compressing a group of basic media data units wherein each basic media data unit is characterized by a first quantization scale, and wherein the step of reducing includes quantizing the amplitudes with a second quantization scale that is higher than the first quantization scale.

The invention provides a method for compressing a group of basic media data units wherein the second quantization scale substantially equals a product of the first quantization scale and a positive integer P.

The invention provides a method for compressing a group of basic media data units wherein amplitudes that range between $-(P/2)$ to $(P/2)$ are mapped to zero.

The invention provides a method for compressing a group of basic media data units wherein P equals 2.

The invention provides a method for compressing a group of basic media data units wherein the basic media data unit is one of the following: a macroblock, a slice, a picture, a sequence of audio signals, a sequence of audio visual signals, a sequence of data, or a stream containing a plurality of streams.

The invention provides a method for compressing a group of basic media data units wherein the group of basic media data units is one of the following: a slice, a picture, a sequence of audio signals, a sequence of audio visual signals, a sequence of data, or a stream containing a plurality of streams.

The invention provides a method for compressing a group of basic media data units wherein a basic media data unit is an MPEG compliant video data.

The invention provides a method for compressing a group of basic media data units wherein the compression ratio reflects the ratio between the size of the group of basic data visual units before the size reduction and a target size of group of basic data visual units after the size reduction.

The invention provides a method for compressing a group of basic media data units wherein the residual ratio (RR) reflects a relationship between (i) an aggregate size (RSG) of basic data visual units of the group that did not undergo step (b), (ii) the target size (TG) of the group of basic data visual units, and (iii) the aggregate size (RTG) of basic data visual units of that did undergo step (b).

The invention provides a method for compressing a group of basic media data units wherein RR=RSG/(TG−RTG).

The invention provides a method for compressing a group of basic media data units wherein RR=(SG−RSG)/RTG, SG being the aggregate size of the group of basic media data units, before the compression started.

The invention provides a method for compressing a group of basic media data units in which the size of a visual data basic is reduced when RR>PCRA.

The invention provides a method for compressing a group of basic media data units wherein the residual ratio (RR) reflects a relationship between (i) an aggregate size (RSG(S)) of basic data visual units of a sub group SG(S) of the group that did not undergo step (b), (ii) the size (TG(S)) of a target sub-group out of the group of basic data visual units, and (iii) the aggregate size (RTG(S)) of basic data visual units of a subgroup that did undergo step (b).

The invention provides a method for compressing a group of basic media data units wherein RR=RSG(S)/(TG(S)−RTG(S)).

The invention provides a method for compressing a group of basic media data units wherein TG(S) is responsive to a difference (RES) between a previous target sub group size TG(S−1) and between an aggregate size (RTG(S−1)) of basic data visual units belonging to the previous sub group.

The invention provides a method for compressing a group of basic media data units wherein the sub group is one of the following: a slice, a picture, a sequence of audio signals, a sequence of audio visual signals, a sequence of data, or a stream containing a plurality of streams.

The invention provides a method for compressing a group of basic media data units wherein the basic media data unit being represented by a plurality of amplitude/runlength pairs, and wherein the step of reducing includes reducing the amount of amplitude/runlength pairs.

The invention provides a method for compressing a group of basic media data units wherein the amplitude/runlength pairs represent DCT coefficients.

Reference is now made to FIG. 1, which is a schematic illustration of a method 10 for compressing a group of basic media data units, in accordance to a preferred embodiment of the invention. It is noted that the method of FIG. 1 is merely a simple example for such a method.

Method 10 starts at initialization step 12 of setting various parameters such as predefined compression ratio PCRA, and determining a predefined relationship between PCRA and a residual ratio (RR). Conveniently, The residual ratio reflecting a relationship between (i) an aggregate size (RSG) of basic data visual units of the group that did not undergo steps 20–30, (ii) the target size (TG) of the group of basic data visual units, and (iii) the aggregate size (RTG) of basic data visual units of that did undergo steps 20–30. According to one aspect of the invention a basic media data unit is either a macroblock, a slice or a picture and the group of basic media data units is either a slice, a picture or a group of pictures, respectively.

Step 12 is followed by step 14 of receiving a group of basic media data units having an aggregate size of SG.

Step 14 is followed by step 16 of calculating the size (TG) of a target group of basic media data units. Conveniently, TG=SG*PCRA. Step 16 also includes setting RR and a basic media data unit index I. RR=PCRA, I=1. According to another aspect of the invention the size of the received group of basic media data units is previously known, and accordingly TG can be calculated at step 12.

Step 16 is followed by steps 18–28 that are repeated for each basic media data unit of the received group of basic media data units. Step 18 of fetching the I'th basic media data unit of the group and partially decode it to provide a plurality of amplitude/runlength pairs that represent the basic media data unit. According to one aspect of the invention, the amplitude/runlength pairs represent at least one DCT block.

Step 18 is followed by step 20 of determining whether the predefined relationship exists between PCRA and RR. Conveniently, the relationship exists when PCRA<RR. If the predefined relationship exists then step 20 is followed by steps 22 and 24, else step 20 is followed by step 26. Step 22 of reducing the size of the basic media data unit. The size prior the reduction is denoted by BVDU(I), while the reduced size is denoted RBVDU(I). Step 22 is followed by step 24 of updating the aggregate size of basic media data units that did undergo either one of steps 18–22: RTG=RTG+RBVDU(I). During step 26 RTG is updated: RTG=RTG+BVDU(I). According to an aspect of the invention, the reduction is performed such that an optimal reduction (compression) to quality degradation is achieved. For example, assuming that a basic media data unit is a macroblock that includes a plurality of amplitude/runlength pairs, the pairs are partially encoded by a variable length encoding scheme. A data reduction can be achieved by quantizing the pairs such that low value amplitudes are mapped to zero, thus reducing the amount of amplitude/runlength pairs.

Steps 24 and 26 are followed by step 28 of updating I, RR and RSG. RSG being the aggregate size of basic media data units the did not undergo either one of steps 18–22. I=I+1, RSG=RSG−BVDU(I), RR=RSG/(TG−RTG).

Step 28 is followed by step 30 of checking whether all the basic media data units of the group of basic media data units did undergo at least one of steps 18–28. If the answer is no, the next basic media data unit of the group is fetched and processed, else step 30 is followed by step 14 of receiving a new group of basic media data units.

Figure 2:
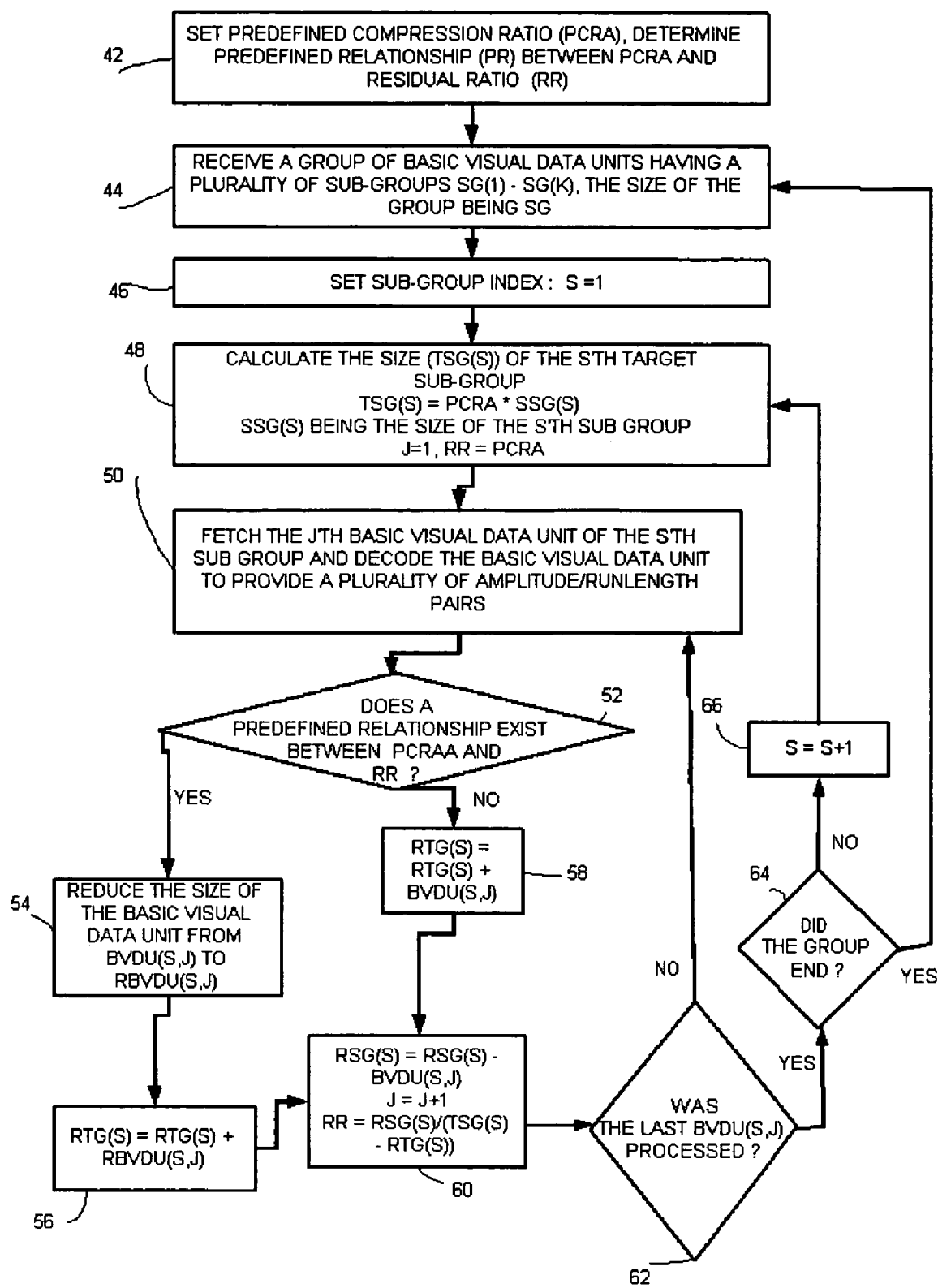

Reference is now made to FIG. 2, which is a schematic illustration of a method 40 for compressing a group of basic media data units, in accordance to a preferred embodiment of the invention. It is noted that the method of FIG. 2 is merely a simple example for such a method.

Method 40 starts at initialization step 42 of setting various parameters such as predefined compression ratio PCRA, and determining a predefined relationship between PCRA and a residual ratio (RR). Conveniently, The residual ratio reflecting a relationship between (i) an aggregate size (RSG(S)) of basic data visual units of the S'th sub-group of the group that did not undergo steps 50–60, (ii) the size (TG(S)) of the S'th sub group of the target group of basic data visual units, and (iii) the aggregate size (RTG(S)) of basic data visual units of the S'th sub-group that did undergo steps 50–60. According to one aspect of the invention a basic media data unit is either a macroblock, a slice or a picture and the sub group of basic media data units is either a slice, a plurality of slices, a picture, a plurality of pictures or a picture, respectively.

Step 42 is followed by step 44 of receiving a group of basic media data units having a size of SG. The group includes a plurality of sub-groups SG(1)–SG(K), the size of each sub group denoted SSG(S), 0<S<(K+1).

Step 44 is followed by step 46 of setting a sub-group index S: S=1.

Step 46 is followed by step 48 of calculating the size (TSG(S)) of the S'th target sub group of basic media data units. Conveniently, TSG(S)=SSG(S)*PCRA. Step 48 also including setting RR and a basic media data unit index J. RR=PCRA, J=1. According to another aspect of the invention the size of the received sub group of basic media data units is previously known, and accordingly TSG(s) can be calculated at step 10.

Step 48 is followed by steps 50–62 that are repeated for each basic media data unit of the S'th sub group of basic media data units. When all the basic media data units of a sub-group were processed, the method goes on to handle the basic media data units of the next sub-group, until all the basic media data unit of the received group are processed.

Step 50 of fetching the J'th basic media data unit of the S'th sub group and partially decoding it to provide a plurality of amplitude/runlength pairs that represent the basic media data unit. According to one aspect of the invention, the amplitude/runlength pairs represent at least one DCT block.

Step 50 is followed by step 52 of determining whether the predefined relationship exists between PCRA and RR. Conveniently, the relationship exists when PCRA<RR. If the predefined relationship exists then step 52 is followed by steps 54 and 56, else step 52 is followed by step 58. Step 54 of reducing the size of the basic media data unit. The size prior to the reduction is denoted by BVDU(S,J), while the reduced size is denoted RBVDU(S,J). Step 54 is followed by step 56 of updating the aggregate size of basic media data units of the S'th sub-group that did undergo step 52: RTG(S)=RTG(S)+RBVDU(S,J). Step 58 of updating RTG(S): RTG(S)=RTG(S)+BVDU(S,J).

Steps 56 and 58 are followed by step 60 of updating J, RR and RSG(S). RSG(S) being the aggregate size of basic media data units of the S'th sub group the did not undergo step 52. J=J+1, RSG(S)=RSG(S)−BVDU(S,J), RR=RSG(S)/(TSG(S)−RTG(S)).

Step 60 is followed by query step 62 of checking whether all the basic media data units of the S'th sub group did undergo step 50. If the answer is no, the next basic media data unit of S'th sub group is fetched and processed, else step 60 is followed by query step 64 of checking whether all the basic media data units of the received group were processed. If the answer is "yes" then step 64 is followed by step 44 of receiving a new group of basic media data units. Else, step 64 is followed by step 66 of updating S: S=S+1 so that the next sub group can be processed. Step 66 is followed by step 48.

Figure 3:
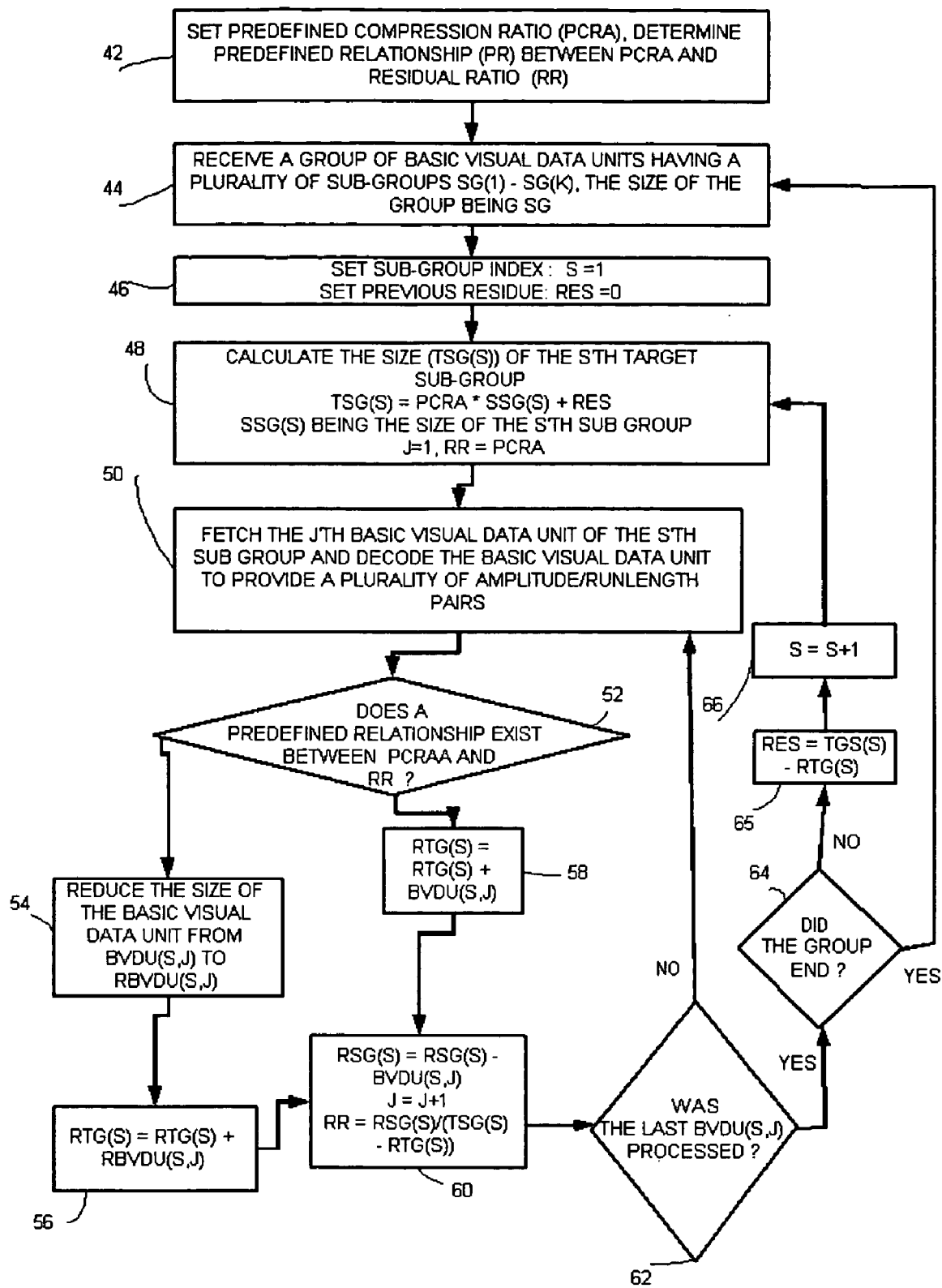

Reference is now made to FIG. 3, which is a schematic illustration of method 41 for compressing a group of basic media data units, in accordance to a preferred embodiment of the invention. Method 41 is analogues to method 40 of FIG. 2 but has an additional step 65 and a slightly different step 48, for allowing the size of a target sub group to be responsive to a residue RES that is left after a previous target sub group was generated. RES equals TGS(S)−RTG(S), thus reflecting a difference between the target size of the previous target sub-group and the aggregate size of basic media data units of the previous sub group, after being processed. RES is an integer, that can be either negative (if TGS(S)<RTG(S)) or positive (else).

Figure 4:
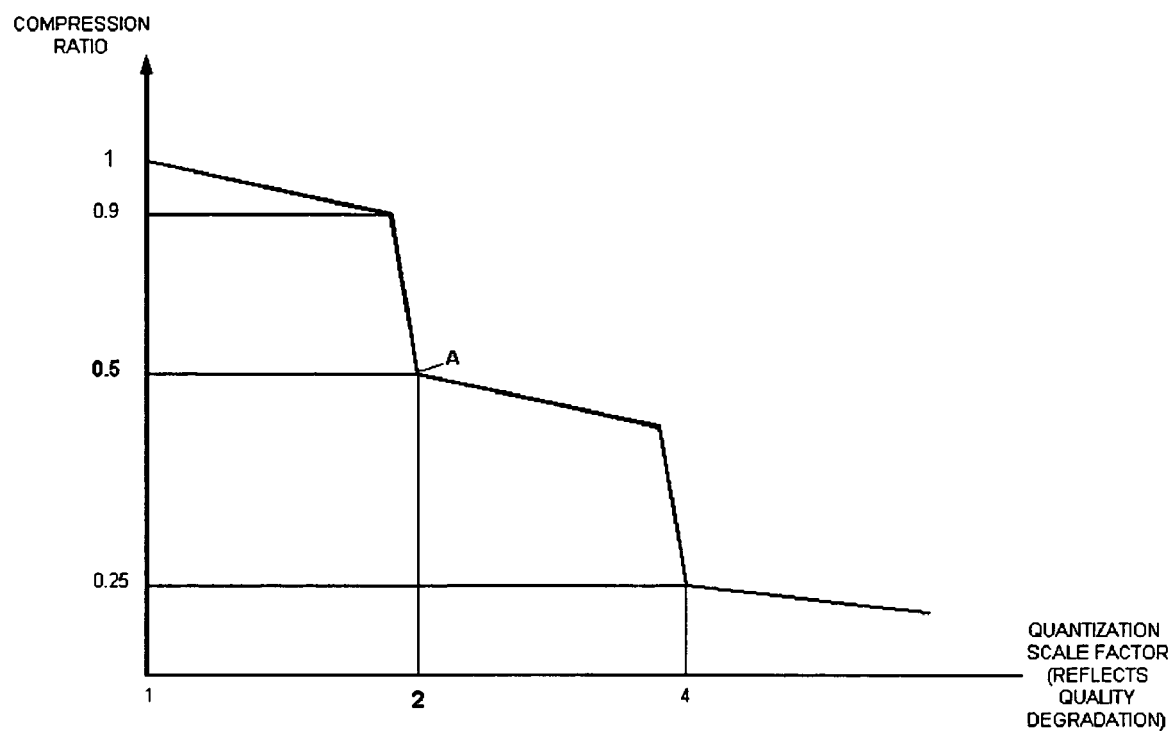
FIG. 4 illustrates the relationship between compression and quality loss of a basic media data unit, in accordance with a preferred embodiment of the present invention.

Reference is made now to FIG. 4, which is a schematic illustration of a relationship between compression and quality reduction, according to a preferred embodiment of the invention. The quality reduction is reflected by a ratio between the quantization scale of a basic media data unit before being reduced, and the quantization scale of the basic media data unit after the reduction takes place. The compression ratio substantially equals the size of a basic media data unit after reduction being divided by the size of the basic media data unit size after reduction. According to an aspect of the invention, the optimal compression to quality reduction ration is achieved at point (A) in which the compression ratio equals 0.5 and the quantization scale ration equals two. The preferred compression ratio is achieved due to the fact that the change in quantization scales mapped amplitudes that were previously "1" to zero. As "1" is a very frequent value for amplitudes, then statistically a large compression is achieved. As the quantization scale was doubled, amplitudes that previously equaled "1" turn to 0.5, whereas amplitudes that range between 0 and 0.5 are mapped to zero. As the basic media data unit is represented by pairs of amplitude/runlength, mapping amplitudes to zero reduces the amount of amplitude/runlength pairs.

It will be appreciated by persons skilled in the art that the present invention is not limited to what has been particularly shown and described hereinabove. Rather the scope of the present invention is defined only by the claims, which follow.

What is claimed is:

1. A method for compressing a group of basic media data units, the method comprising the steps of:
   (a) receiving the group of basic media data units;
   (b) for each basic media data unit of the group performing the steps of:
      (b1) partially decoding at least a portion of the basic media data unit to provide a plurality of amplitude/runlength pairs;
      (b2) determining whether to reduce the size of the basic media data unit in view of a predefined relationship between a predefined compression ratio (PCRA) and a residual ratio (RR);
      (b3) reducing the size of the basic media data unit, in view of the determination, by changing the values of at least some of the amplitudes; and
      (b4) partially encoding the basic media data unit.

2. The method of claim 1 wherein the amplitude/runlength pairs represent DCT coefficients.

3. The method of claim 1 wherein the step of reducing comprises mapping low value amplitudes to zero.

4. The method of claim 3 wherein the absolute value of the low-value amplitudes equals one.

5. The method of claim 1 wherein the step of reducing comprises quantizing the amplitudes.

6. The method of claim 5 wherein each basic media data unit is characterized by a first quantization scale, and wherein the step of reducing comprises quantizing the amplitudes with a second quantization scale that is higher than the first quantization scale.

7. The method of claim 5 wherein the second quantization scale substantially equals a product of the first quantization scale and a positive integer P.

8. The method of claim 6 wherein amplitudes that range between $-(P/2)$ to $(P/2)$ are mapped to zero.

9. The method of claim 7 wherein P equals 2.

10. The method of claim 1 wherein the basic media data unit is selected from the list consisting of:
    a macroblock;
    a slice;
    a picture;
    a sequence of audio signals;
    a sequence of audio visual signals;
    a sequence of data; and
    a stream containing a plurality of streams.

11. The method of claim 10 wherein the group of basic media data units is selected from the list consisting of:
    slice;
    picture;
    group of pictures;
    a sequence of audio signals;
    a sequence of audio visual signals;
    a sequence of data; and
    a stream containing a plurality of streams.

12. The method of claim 1 wherein a basic media data unit is an MPEG compliant video data.

13. The method of claim 1 wherein the compression ratio reflects the ratio between the size of the group of basic data visual units before the size reduction and a target size of group of basic data visual units after the size reduction.

14. The method of claim 13 wherein the residual ratio (RR) reflects a relationship between (i) an aggregate size (RSG) of basic data visual units of the group that did not undergo step (b), (ii) the target size (TG) of the group of basic data visual units, and (iii) the aggregate size (RTG) of basic data visual units of that did undergo step (b).

15. The method of claim 14 wherein $RR=RSG/(TG-RTG)$.

16. The method of claim 14 wherein $RR=(RG-RSG)/RTG$.

17. The method of claim 1 wherein reducing a visual data basic unit if $RR>PCRA$.

18. The method of claim 1 wherein the residual ratio (RR) reflects a relationship between (i) an aggregate size (RSG(S)) of basic data visual units of a sub group SG(S) of the group that did not undergo step (b), (ii) the size (TG(S)) of a target sub-group out of the group of basic data visual units, and (iii) the aggregate size (RTG(S)) of basic data visual units of a subgroup that did undergo step (b).

19. The method of claim 17 wherein $RR=RSG(S)/(TG(S)-RTG(S))$.

20. The method of claim 17 wherein TG(S) is responsive to a difference (RES) between a previous target sub group size TG(S−1) and between an aggregate size (RTG(S−1)) of basic data visual units belonging to the previous sub group.

21. The method of claim 17 wherein the sub group being selected from the list consisting of:
    a slice;
    a plurality of slices;
    a picture;
    a plurality of pictures;
    a sequence of audio signals;
    a sequence of audio visual signals;
    a sequence of data; and
    a stream containing a plurality of streams.

* * * * *